(12) United States Patent
Klehn et al.

(10) Patent No.: US 6,586,960 B2
(45) Date of Patent: Jul. 1, 2003

(54) MEASURING DEVICE FOR TESTING UNPACKED CHIPS

(75) Inventors: Bernd Klehn, München (DE); Bernhard Knuepfer, Greilling (DE)

(73) Assignee: Infineon Technologies AG, Munich (DE)

(*) Notice: Subject to any disclaimer, the term of this patent is extended or adjusted under 35 U.S.C. 154(b) by 7 days.

(21) Appl. No.: 10/005,977

(22) Filed: Dec. 3, 2001

(65) Prior Publication Data

US 2002/0070740 A1 Jun. 13, 2002

(30) Foreign Application Priority Data

Dec. 1, 2000 (DE) .......................................... 100 59 745

(51) Int. Cl.$^7$ ............................................... G01R 31/26

(52) U.S. Cl. ....................................... 324/765; 324/754

(58) Field of Search ................................. 324/754, 765, 324/755, 158.1, 537, 555; 29/827, 846, 840; 437/220, 8, 205, 206; 257/777, 69; 156/634; 438/18, 675, 108, 686, 612, 614

(56) References Cited

U.S. PATENT DOCUMENTS

| | | | | |
|---|---|---|---|---|
| 5,302,891 A | * | 4/1994 | Wood | 324/158.1 |
| 5,440,240 A | * | 8/1995 | Wood | 324/158.1 |
| 5,594,358 A | | 1/1997 | Ishikawa et al. | |
| 5,678,301 A | * | 10/1997 | Gochnour | 29/827 |

* cited by examiner

Primary Examiner—Kamand Cuneo
Assistant Examiner—Trung Q. Nguyen
(74) Attorney, Agent, or Firm—Laurence A. Greenberg; Werner H. Stemer; Ralph E. Locher

(57) ABSTRACT

A measuring device has a needle-board circuit board carrying a large number of contact-making needles for contacting connecting areas on an IC circuit. The measuring device has lines for feeding test signals at a high clock frequency to the contact-making needles, and for carrying measured signals away from the contact-making needles. The needles have a shank part with a length L2 and a tip part 14 adjacent thereto with a length L1. For optimally transmitting signals in terms of impedance, the lines are formed as dual-transmission conductor tracks, the shank parts of the contact-making needles each contact a section of the conductor tracks, and the overall length of the contact-making needles satisfies: $L1+L2<\lambda/2$, where $\lambda$ is the maximum wavelength of the signal that is transmitted via a respective line.

13 Claims, 2 Drawing Sheets

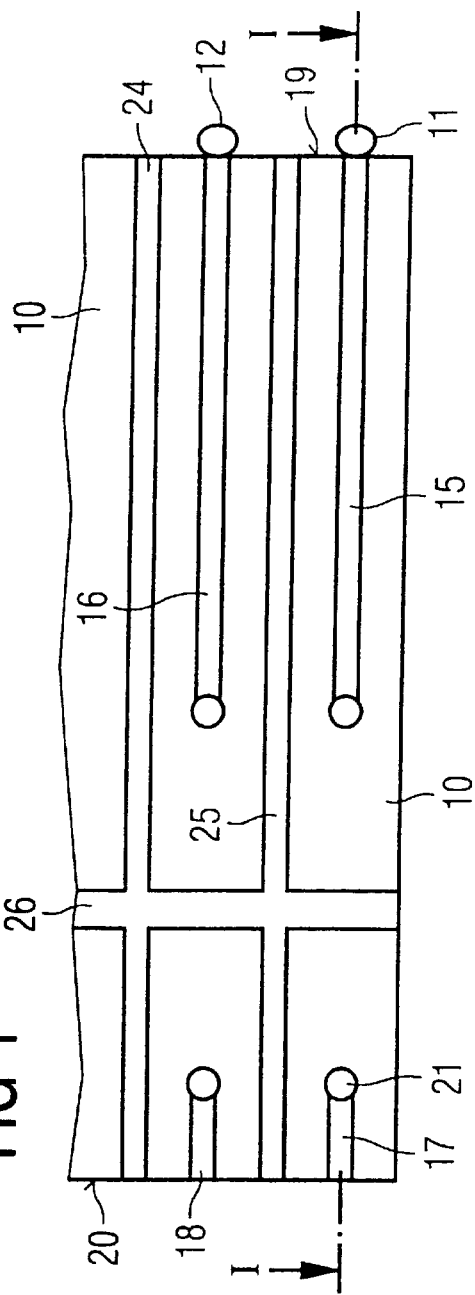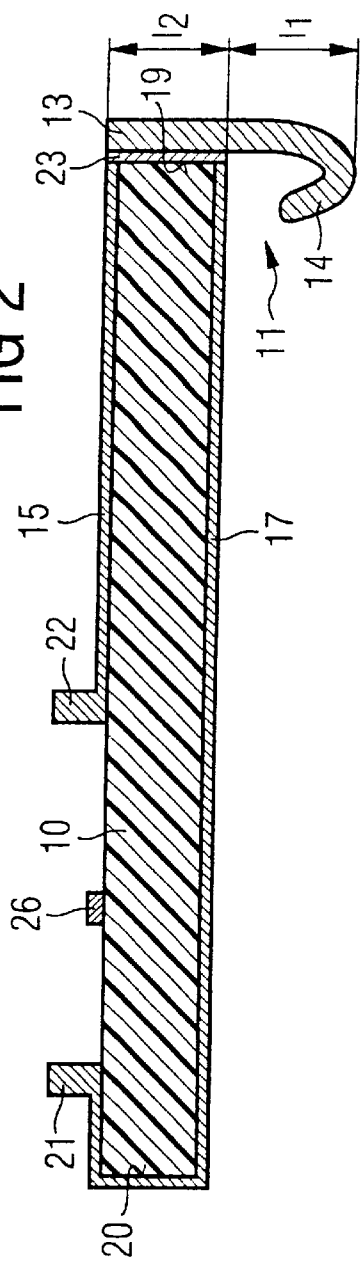

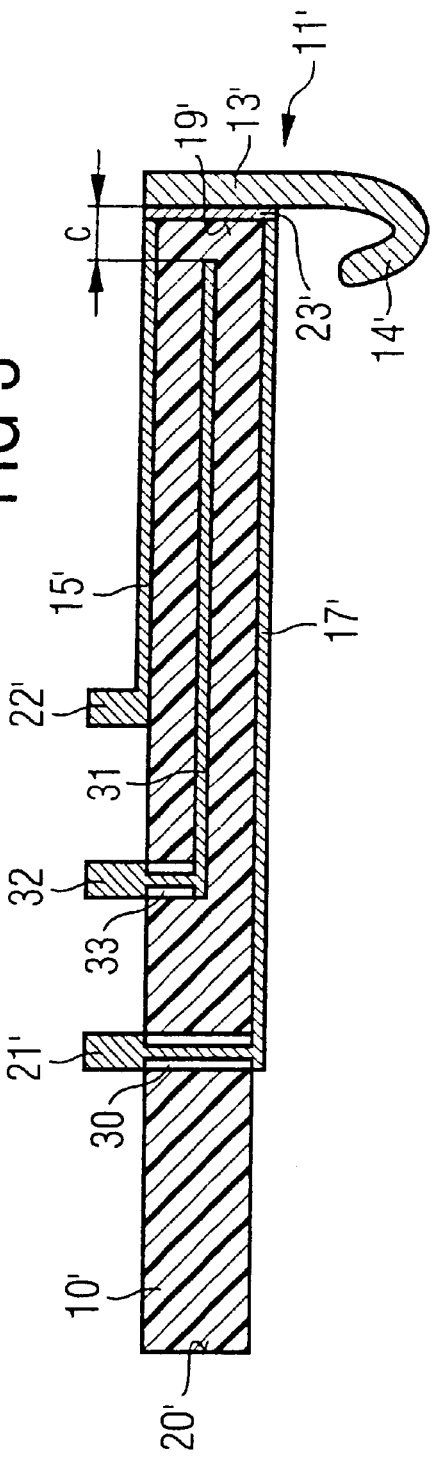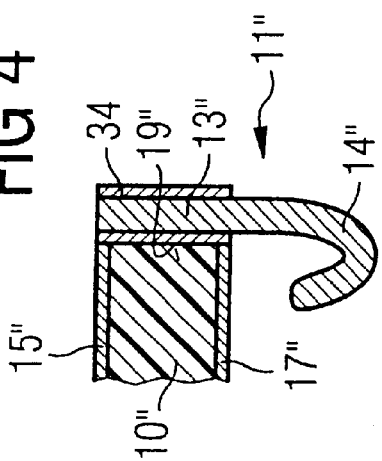

MEASURING DEVICE FOR TESTING UNPACKED CHIPS

BACKGROUND OF THE INVENTION

Field of the Invention

The invention relates to a measuring device for testing unpacked chips, in particular IC circuits. The measuring device includes a needle-board circuit board and a large number of contact-making needles, which are carried by the needle-board circuit board, for making contact with connecting areas (pads) belonging to an IC circuit. The measuring device also includes lines for feeding test signals, at a clock frequency in the MHz range or a higher frequency, to the contact-making needles and for carrying measured signals away from the contact-making needles. The contact-making needles have a shank part with a length $l_2$ and a tip part, adjacent thereto, with a length $l_1$. Each of the shank parts of the contact-making needles contacts a section of the conductor tracks. Such a measuring device is disclosed in U.S. Pat. No. 5,594,358.

In the development of chips, for example in the form of IC circuits, a testing process is in widespread use in which, signals are applied simultaneously to a large number of connecting areas, so-called pads, and an equally large number of measured signals are tapped off. These signals are applied at a clock frequency that is normally several hundred megahertz by means of high-speed electronic interfaces. In order to transmit the signals to the pads and to tap off measured signals from the pads, a needle-board circuit board is used which has a large number of contact-making needles to make contact with the pads. Hitherto, the contact-making needles have typically had a length of about 15 to 40 mm. For transmitting signals, wire lines are used which are connected to the high-speed interfaces and are connected, via wiring tracks on the needle board, to the shank parts of the contact-making needles.

The problem with these known measuring devices is that the wire lines do not ensure optimal impedance matching when high-frequency technology is involved. This means that the contact-making needles are not matched in terms of impedance to the 50-Ω characteristic impedance of the other feed network. Because of this mismatching, there is a discontinuity in the transmission of the high-frequency waves, which generally leads to reflections and therefore to attenuation of the transmitted waves. A further source relating to signal impairment, specifically to signal attenuation, lies in the configuration of solder points, which have hitherto been used to connect the contact-making needles to the needle-board circuit board. This source of interference constitutes a geometric discontinuity in the waveguide arrangement of the signal transmission and leads to attenuation of the signals. In addition, the measuring devices used hitherto do not permit any mass shielding of the signal lines, and therefore, the previous measuring devices are sensitive to coupled in interference signals, in particular to signal crosstalk. In addition, when the lengths of the needles are unfavorable in relation to the wavelengths of the transmitted signals, the contact-making needles radiate signal power and likewise contribute to attenuation of the transmitted signals. A further source of signal interference is the parasitic tuned circuit which necessarily results from the effective needle inductance and the input capacitance of a chip pad, plus the connected circuits.

SUMMARY OF THE INVENTION

It is accordingly an object of the invention to provide a measuring device for testing unpacked chips which overcomes the above-mentioned disadvantages of the prior art apparatus of this general type. In particular, it is an object of the invention to provide a measuring device that permits more accurate signal measurement and optimal interference signal suppression.

With the foregoing and other objects in view there is provided, in accordance with the invention, a measuring device for testing unpacked chips that includes a needle-board circuit board carrying a plurality of contact-making needles for making contact with connecting areas on an IC circuit. The needle-board circuit board has lines for feeding test signals with a clock frequency that is at least in a megahertz range to the plurality of the contact-making needles. These lines are also for carrying measured signals away from the plurality of the contact-making needles. Each one of the plurality of the contact-making needles includes a shank part having a length $l_2$ and a tip part having a length $l_1$. The tip part is adjacent the shank part. Each one of the lines has a section making contact with the shank part of a respective one of the plurality of the contact-making needles. The lines are formed as dual-transmission conductor tracks on the needle-board circuit board. Each one of the plurality of the contact-making needles has an overall length such that $l_1+l_2<\lambda/2$, where $\lambda$ is a maximum wavelength of the signal that is transmitted via a respective one of the lines.

Accordingly, the invention provides for transmission-line wiring in combination with a low-impedance contact-making needle in which these needles directly contact the transmission-line lines. The transmission-line wiring ensures extremely short feed lines from the needle board to the contact pads of a chip or IC, so that interference, which is caused by excessively long feed lines, is largely suppressed.

The "short" needle in the sense of the invention, in which the overall needle length of the contact-making needles is less than the wavelength of the transmitted signals, provides the advantage that a 50-Ω characteristic impedance is ensured in the area of the contact-making needles corresponding to that of the feed-line network. The combination of a short needle and a transmission-line signal supply line to the needle permits signal transmission to an IC contact pad and away from the latter with an optimum impedance and therefore with the lowest possible attenuation.

In order to optimize the impedance matching, the overall length of the contact-making needles is selected to be considerably smaller than a quarter wavelength of the transmitted signals. In view of the frequency that is typically transmitted, including harmonics, up to the region of 1 to 10 GHz, the overall length of the contact-making needles is preferably about 5 mm.

The invention envisages a plurality of possible ways for connecting the contact-making needles to the conductor tracks of the needle-board circuit board, as indicated below.

According to one connection variant, each line, which is provided in the form of a conductor track on the needle-board circuit board, has a signal feed part on one side of the needle-board circuit board and a measured signal discharge part on the other side of the needle-board circuit board. The signal feed part is connected to the signal discharge part of the line via a contact-making needle connecting part. This contact-making needle connecting part runs over the narrow side of the needle-board circuit board and is in the form of a continuation of the conductor tracks on the two needle-board circuit board surfaces.

Alternatively, each line has a signal feed part on one side of the needle-board circuit board and a measured signal discharge part on the other side of the needle-board circuit board in which the signal feed part is connected to the signal discharge part of the line via a contact-making needle connecting part, however, this contact-making needle connecting part runs through a contact via in the needle-board circuit board. The shank part of a contact-making needle is inserted into a corresponding one of the vias.

In order to optimize the low level of interference in the signal transmission by means of the dual transmission conductor tracks, the invention provides for a ground line to be arranged between the signal feed part and the measured signal discharge part of the line. The ground line ends with its free end at a distance C from the shank part of the contact-making needle. This distance C is related to the characteristic impedance and the length $l_2$ as follows:

$$w = \sqrt{L_2/C},$$

$L_2$ being the inductance of the contact-making needle, C being the capacitance to ground of the conductor track to which the contact-making needle is connected;

$$L_2 = \mu \times \mu_0 \times l_2$$

where $\mu$ is the magnetic permeability of the needle material, and $\mu_0$ is the magnetic field constant; and $$C = \epsilon \times \epsilon_0 \times b \times l_2 / c$$

where $\epsilon$ is the dielectric constant of the needle circuit board material, $\epsilon_0$ being the permitivity and b being the width of that conductor track to which the contact-making needle is connected.

Here, the distance c should be selected such that the characteristic impedance w agrees exactly as possible with the characteristic impedance in the dual-transmission conductor area. The ground line can be provided in sandwich fashion between the signal feed part and the signal discharge part, and can be in the shape of an at least approximately equally wide conductor track. As an alternative to this, the ground line can be arranged as a continuous ground plane between the signal feed parts and the measured signal discharge lines of a large number of dual-transmission conductor tracks located beside one another.

In addition to the ground line indicated above, ground lines can be arranged between the dual-transmission conductor tracks running beside one another that make contact with a large number of contact-making needles. This, too, contributes to interference-free signal transmission.

Other features which are considered as characteristic for the invention are set forth in the appended claims.

Although the invention is illustrated and described herein as embodied in a measuring device for testing unpacked chips, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 shows a plan view of a first embodiment of a needle-board circuit board of a measuring device;

FIG. 2 shows a longitudinal section illustration of the arrangement of FIG. 1 along the line I—I;

FIG. 3 shows a second embodiment of the needle-board circuit in the form of a PCB needle-board circuit board; and FIG. 4 shows the needle-board circuit board modified with a via to accommodate the shank part of a contact-making needle.

DESCRIPTION OF THE PREFERRED EMBODIMENTS

Referring now to the figures of the drawing in detail and first, particularly, to FIGS. 1 and 2 thereof, there is shown a needle-board circuit board 10 that is used to route signals to and away from a large number of contact-making needles. Two of these contact-making needles 11 and 12 are shown in plan view in FIG. 1. As FIG. 2 reveals, each contact-making needle, the contact-making needle 11 in the example shown, includes a shank part 13 and a tip part 14, which is bent over in a V shape in the embodiment illustrated. Contact is made with a pad at the vertex of the bend in the tip part 14.

For transmitting signals to and from the contact-making needles 11, 12, one dual-transmission line or conductor track is provided for each needle. In FIG. 1, two conductor tracks are provided for the two contact-making needles 11, 12. Each of these conductor tracks includes a signal feed part 15, 16 running on the upper side of the needle-board circuit board 10, and a measured signal discharge part 17, 18. As best revealed by FIG. 2, each dual-transmission conductor track is formed continuously from its signal feed part 15 and its measured signal discharge part 17. The feed part 15 runs on the upper side of the needle-board circuit board, while the discharge part 17 runs on the underside of the needle-board circuit board, under the feed part 15, from one needle-board circuit board narrow side 19 to the opposite narrow side 20. In particular, the measured signal discharge part 17 runs from the underside of the needle-board circuit board, over the narrow side 20 to the upper side of the needle-board circuit board and ends there in a connecting element 21. On the upper side of the needle-board circuit board 10, the signal feed part 15 likewise ends in a connecting element 22 that is at a distance from the connecting part 21 of the measured signal discharge part 17.

If, in connection with feeding signals, mention is made of a feed part and a discharge part, these parts can also be interchanged, that is to say, the part presently designated as the feed part can also be a discharge part, and the presently designated discharge part can form a feed part.

As can be seen from FIG. 2, the signal feed part 15 and the measured signal discharge part 17 are formed integrally on the narrow side 19 or are connected to a contact-making needle connecting part 23 that extends to the conductor track 15, 17 on both sides of the needle-board circuit board 10 and connects them to each other. The shank part of the contact-making needle 11 has a conductive connection to the contact-making needle connecting part.

According to the invention, the overall length of the contact-making needles is selected to be considerably smaller than the wavelength of the signals transmitted via the dual-transmission conductor track, so that it is true that: $l_1 + l_2 < \lambda$, where $\lambda$ is the signal wavelength, $l_1$ designates the length of the tip part of the contact-making needle, and $l_2$ designates the length of the shank part 13 of the contact-making needle 11. In particular, the part of the contact-making needle 11 that is in contact with the contact-making needle connecting part 23 of the dual-transmission line is presently designated as the shank part 13.

In addition, the needle-board circuit board 10 includes a network of ground conductors or ground tracks. These ground tracks are designated by 24 and 25 in FIG. 1. The ground tracks 24, 25 extend between the dual-transmission conductor tracks. These dual-transmission conductor tracks run parallel and beside one another in order to make contact with the contact-making needles 11, 12, on both sides of the circuit board 10. The ground tracks 24, 25 end at a distance from the contact-making needles 11, 12, run on both sides of the needle-board circuit board 10, and over the narrow sides 19 and 20 of the circuit board 10. The ground tracks 24, 25 are mutually connected to a ground connecting track 26, which runs between contact elements, for example, the contact elements 21, 22 which are shown in FIG. 2. That is to say the ground tracks 24, 25 run at right angles to the ground connecting track 26.

The combination of the transmission-line wiring of the contact-making needles and the low-impedance formation of the contact-making needles, in conjunction with the ground line network, the relatively very short design of the contact-making needles and the immediate contact with the needles by means of the dual-transmission conductor tracks, means that signals can be transmitted substantially without interference to and away from the contact-making needles, with optimal impedance matching.

FIG. 4 shows a modification of the connection between a contact-making needle 11" and the dual-transmission line 15", 17" via a via 34 on one narrow side of the circuit board 10". The shank part 13" is accommodated completely in the via 34.

FIG. 3 shows an embodiment of a needle-board circuit board, alternate to that shown in FIGS. 1 and 2, in the shape of a PCB circuit board. The dual-transmission conductor track which is shown in FIG. 3 corresponds to the dual-transmission conductor track 15, 17, 20, 23 from FIG. 2, with the difference that the measured signal discharge part 17' is not routed over the narrow side 20' to the upper side of the circuit board but rather is routed through a via 30 to the upper side of the circuit board and ends there in the connecting element 21'. The contact-making needle 11' contacts the contact-making needle connecting part 23' on the narrow side 19' of the contact-making circuit board 10' identically to that shown in FIG. 2.

Likewise, as opposed to the embodiment shown in FIGS. 1 and 2, a ground conductor network is provided in FIG. 3, from which (in order first to guarantee a uniform ground potential over the entire needle-board circuit board and second to prevent any crosstalk between the lines on the upper side and under side of the needle-board circuit board, a continuous ground conductor surface 31 must extend over the entire area of the circuit board, and is interrupted only by via lead throughs, such as the via 30) a ground conductor surface 31 runs between the signal feed part 15' and the signal discharge part 17', parallel to the latter and within the needle-board circuit board 10, and ends in a connecting element 32 located between the connecting elements 21' and 22' of the dual-transmission conductor track. The connection between this connecting element 32 and the ground conductor 31 is made via a via 33 which opens into the upper side of the needle-board circuit board 10'. The end of the conductor track 31 that is remote from the connecting element 32 ends at a distance C from the contact-making needle connecting part 23' on the narrow side 19' of the needle-board circuit board 10'. For optimal impedance matching:

$$W=\sqrt{L_2/C},$$

where $L_2$ is the inductance of the contact-making needle, C is the capacitance to ground of the conductor track to which the contact-making needle is connected;

$$L_2=\mu\times\mu_0\times l_2,$$

where $\mu$ is the magnetic permeability of the needle material, and $\mu_0$ is the magnetic field constant;

$$C=\epsilon\times\epsilon_0\times b\times l_2/c$$

where $\epsilon$ is the dielectric constant of the needle circuit board material, $\epsilon_0$ is the permitivity, and b is the width of that conductor track to which the contact-making needle is connected.

Here, the distance c has to be selected such that the characteristic impedance w agrees as exactly as possible with the characteristic impedance in the dual-transmission conductor area.

The ground network on the upper side and the under side of the circuit board 10 of FIG. 1 can additionally be provided in the embodiment of FIG. 3.

We claim:

1. A measuring device for testing unpacked chips, comprising:

a needle-board circuit board carrying a plurality of contact-making needles for making contact with connecting areas on an IC circuit;

said needle-board circuit board having lines for feeding test signals having a clock frequency that is at least in a megahertz range to said plurality of said contact-making needles, said lines also for carrying measured signals away from said plurality of said contact-making needles;

each one of said plurality of said contact-making needles including a shank part having a length $l_2$ and a tip part having a length $l_1$, said tip part being adjacent said shank part;

each one of said lines having a section making contact with said shank part of a respective one of said plurality of said contact-making needles;

said lines being formed as dual-transmission conductor tracks on said needle-board circuit board;

each one of said plurality of said contact-making needles having an overall length such that $l_1+l_2<\lambda/2$; and $\lambda$ being a maximum wavelength of a signal transmitted via a respective one of said lines.

2. The measuring device according to claim 1, wherein the overall length of each one of said plurality of said contact-making needles is such that $l_1+l_2\leq\lambda/4$.

3. The measuring device according to claim 2, wherein:

said needle-board circuit board has a first side, a second side, and a narrow side running between said first side and said second side;

each one of said lines includes a signal feed part, a measured signal discharge part, and a contact-making needle connecting part that connects said signal feed part to said signal discharge part;

said signal feed part of each one of said lines is located on said first side of said needle-board circuit board;

said measured signal discharge part of each one of said lines is located on said second side of said needle-board circuit board; and said contact-making needle connecting part of each one of said lines runs over said narrow side of said needle-board circuit board.

4. The measuring device according to claim 1, wherein:

said needle-board circuit board has a first side, a second side, and a narrow side running between said first side and said second side;

each one of said lines includes a signal feed part, a measured signal discharge part, and a contact-making needle connecting part that connects said signal feed part to said signal discharge part;

said signal feed part of each one of said lines is located on said first side of said needle-board circuit board;

said measured signal discharge part of each one of said lines is located on said second side of said needle-board circuit board; and said contact-making needle connecting part of each one of said lines runs over said narrow side of said needle-board circuit board.

5. The measuring device according to claim 4, comprising a ground line configured between said signal feed part and said measured signal discharge part of each one of said plurality of said lines.

6. The measuring device according to claim 5, comprising:

a ground line via;

said ground line passing through said needle-board circuit board by passing through said ground line via.

7. The measuring device according to claim 1, wherein:

the overall length of each one of said plurality of said contact-making needles is such that $l_1+l_2<\lambda/4$;

said needle-board circuit board has a first side, and a second side;

said needle-board circuit board is formed with a plurality of contact vias;

said shank part of each one of said plurality of said contact-making needles is inserted into a respective one of said plurality of said plurality of contact vias;

each one of said lines includes a signal feed part, a measured signal discharge part, and a contact-making needle connecting part that connects said signal feed part to said signal discharge part;

said signal feed part of each one of said lines is located on said first side of said needle-board circuit board;

said measured signal discharge part of each one of said lines is located on said second side of said needle-board circuit board; and said contact-making needle connecting part of each one of said lines running through a respective one of said plurality of contact vias.

8. The measuring device according to claim 1, wherein:

said needle-board circuit board has a first side, and a second side;

said needle-board circuit board is formed with a plurality of contact vias;

said shank part of each one of said plurality of said contact-making needles is inserted into a respective one of said plurality of said plurality of contact vias;

each one of said lines includes a signal feed part, a measured signal discharge part, and a contact-making needle connecting part that connects said signal feed part to said signal discharge part;

said signal feed part of each one of said lines is located on said first side of said needle-board circuit board;

said measured signal discharge part of each one of said lines is located on said second side of said needle-board circuit board; and said contact-making needle connecting part of each one of said lines running through a respective one of said plurality of contact vias.

9. The measuring device according to claim 8, comprising a ground line configured between said signal feed part and said measured signal discharge part of each one of said plurality of said lines.

10. The measuring device according to claim 9, comprising:

a ground line via;

said ground line passing through said needle-board circuit board by passing through said ground line via.

11. The measuring device according to claim 1, comprising:

ground lines formed as ground line tracks that are configured between said lines;

said lines running beside one another.

12. The measuring device according to claim 1, wherein the overall length each one of said plurality of said contact-making needles is about 5 mm.

13. The measuring device according to claim 1, wherein:

said tip part of each one of said plurality of said contact-making needles has a bend at which said tip part is bent over; and the length of said tip part is defined as a length from said shank part to said bend.

* * * * *